US012696668B2

(12) United States Patent
    Kim et al.

(10) Patent No.: US 12,696,668 B2
(45) Date of Patent: Jul. 28, 2026

(54) DISPLAY DEVICE

(71) Applicant: Samsung Display Co., LTD., Yongin-si (KR)

(72) Inventors: Tae Ho Kim, Yongin-si (KR); Oh Jeong Kwon, Yongin-si (KR); Hyeo Ji Kang, Yongin-si (KR); Mi Hwa Lee, Yongin-si (KR); Hong Yeon Lee, Yongin-si (KR); Sung Gyu Jang, Yongin-si (KR); Seung Yeon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 363 days.

(21) Appl. No.: 18/450,828

(22) Filed: Aug. 16, 2023

(65) Prior Publication Data

US 2024/0206292 A1     Jun. 20, 2024

(30) Foreign Application Priority Data

Dec. 19, 2022     (KR) ......................... 10-2022-0178534

(51) Int. Cl.
    *H10K 59/80*        (2023.01)
    *H10K 59/122*      (2023.01)
(52) U.S. Cl.
    CPC ......... *H10K 59/879* (2023.02); *H10K 59/122* (2023.02); *H10K 59/8792* (2023.02)

(58) Field of Classification Search
    CPC . H10K 59/879; H10K 59/122; H10K 59/8792
    USPC ........................................................... 257/40
    See application file for complete search history.

(56) References Cited

U.S. PATENT DOCUMENTS

| | | | |
|---|---|---|---|
| 10,008,692 B2 | 6/2018 | Kwak | |
| 10,388,913 B2 | 8/2019 | Jung et al. | |
| 2021/0184179 A1 | 6/2021 | Kim et al. | |
| 2022/0077256 A1* | 3/2022 | Lim ........................ H10K 59/40 |
| 2022/0209203 A1* | 6/2022 | Kim ...................... G06F 3/0412 |
| 2022/0238848 A1 | 7/2022 | Kwon et al. | |

FOREIGN PATENT DOCUMENTS

| | | |
|---|---|---|
| KR | 10-2021-0081603 A | 7/2021 |
| KR | 10-2367247 B1 | 2/2022 |
| KR | 10-2022-0108287 A | 8/2022 |
| KR | 10-2433274 B1 | 8/2022 |
| KR | 10-2491876 B1 | 1/2023 |

* cited by examiner

*Primary Examiner* — Tu-Tu V Ho

(74) *Attorney, Agent, or Firm* — Womble Bond Dickinson (US) LLP

(57) ABSTRACT

A display device includes a display part, and an outer part on the display part. The outer part includes a first layer and a second layer forming an interface with the first layer. A refractive index of the first layer is lower than a refractive index of the second layer such that light is totally reflected at the interface.

18 Claims, 11 Drawing Sheets

TRS: 2000, 3000

TRS: 2000, 3000

TRS: 2000, 3000

DISPLAY DEVICE

CROSS-REFERENCE TO RELATED APPLICATION

The present application claims priority to and the benefit of Korean patent application No. 10-2022-0178534 filed on Dec. 19, 2022 in the Korean Intellectual Property Office, the entire disclosure of which is incorporated herein by reference.

BACKGROUND

1. Field

Aspects of some embodiments of the present disclosure generally relate to a display device.

2. Related Art

With the development of information technologies, the importance of display devices which provide a connection medium between user and information has increased. Display devices may include a light emitting element, and include a pattern structure for improving external visibility.

Meanwhile, studies on structures for improving the light emission efficiency of display devices have been conducted. However, a case where a process is additionally required to improve light emission efficiency is general. Accordingly, a structure may be desired, in which any process is not unnecessarily required, and light emission efficiency is relatively improved.

The above information disclosed in this Background section is only for enhancement of understanding of the background and therefore the information discussed in this Background section does not necessarily constitute prior art.

SUMMARY

Aspects of some embodiments include a display device having relatively improved light efficiency.

According to some embodiments of the present disclosure, a display device may include: a display part; and an outer part on the display part, wherein the outer part includes a first layer and a second layer forming an interface with the first layer, and wherein a refractive index of the first layer is lower than a refractive index of the second layer such that light is totally reflected at the interface.

According to some embodiments, the display device may further include a sensing part located between the display part and the outer part, the sensing part including conductive patterns. According to some embodiments, the conductive patterns may form sensing electrodes configured to sense a user input. According to some embodiments, the first layer may overlap with the conductive patterns in a plan view.

According to some embodiments, the display part may include organic light emitting elements and a thin film encapsulation layer on the organic light emitting elements. According to some embodiments, the sensing part may be located on the thin film encapsulation layer.

According to some embodiments, the display device may further include a low reflection inorganic layer between the organic light emitting elements and the thin film encapsulation layer.

According to some embodiments, the display device may further include sub-pixels forming sub-pixel areas while each emitting light of one color. According to some embodiments, in a plan view, the first layer may overlap with an area between the sub-pixel areas.

According to some embodiments, the first layer may include a light absorbing material and a low refractive material.

According to some embodiments, the low refractive material may include a monomer including a fluorine-based functional group.

According to some embodiments, the monomer may include at least one selected from the group consisting of 3-(perfluorohexyl)propyl epoxide, octafluoropentyl methacrylate, and heptadecafluorodecyl methacrylate.

According to some embodiments, the monomer may be included by 5 wt % to 20 wt % with respect to a solid content of a material forming the first layer.

According to some embodiments, the low refractive material may include nano particles including hollow particles.

According to some embodiments, the second layer may be a reflection control layer including a dye, a pigment or a combination thereof.

According to some embodiments, the second layer may be a color filter which allows light of one color to be selectively transmitted therethrough.

According to some embodiments, the display device may further include sub-pixels forming sub-pixel areas while each emitting light of one color. According to some embodiments, in the display part, the sub-pixels may include light emitting elements configured to emit lights of different colors.

According to some embodiments, the display device may further include sub-pixels forming sub-pixel areas while each emitting light of one color. According to some embodiments, in the display part, the sub-pixels may include light emitting elements configured to emit light of the same color.

According to some embodiments, the display part may include a display base layer. According to some embodiments, a side surface of the first layer may be formed inclined to form an angle with respect to the display base layer.

According to some embodiments, the angle may be 70 degrees to 90 degrees.

According to some embodiments, the display part may include a light emitting layer and a pixel defining layer defining a position of the light emitting layer. According to some embodiments, the pixel defining layer may overlap with the first layer in a plan view, and protrude from the first layer to form an offset.

According to some embodiments, a difference between the refractive index of the first layer and the refractive index of the second layer may be 0.10 to 0.55.

According to some embodiments of the present disclosure, a display device may include: sub-pixels forming sub-pixel areas while each including a light emitting element; a first layer overlapping with an area between adjacent sub-pixel area in a plan view; and a second layer on the sub-pixel areas, the second layer overlapping with the light emitting element in a plan view, wherein the first layer has a first refractive index, wherein the second layer has a second refractive index higher than the first refractive index, and wherein a difference between the second refractive index and the first refractive index is 0.10 to 0.55.

According to some embodiments of the present disclosure, a display device may include: a display part; a sensing part on the display part, the sensing part including sensing electrodes; and an outer part on the sensing part, the outer part including a first layer and a second layer forming an interface with the first layer, wherein a refractive index of the first layer is lower than a refractive index of the second layer, and wherein the first layer overlaps with the sensing electrodes in a plan view.

BRIEF DESCRIPTION OF THE DRAWINGS

Aspects of some embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Aspects of some embodiments of the present disclosure may apply various changes and different shape, therefore the present disclosure only illustrates certain characteristics with some example embodiments. However, the examples do not limit to certain shapes but apply to all the change and equivalent material and replacement. The drawings included are illustrated a fashion where the figures are expanded for the better understanding.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Aspects of some embodiments of the present disclosure generally relate to a display device. Hereinafter, a display device according to some embodiments of the present disclosure will be described with reference to the accompanying drawings.

Figure 1:
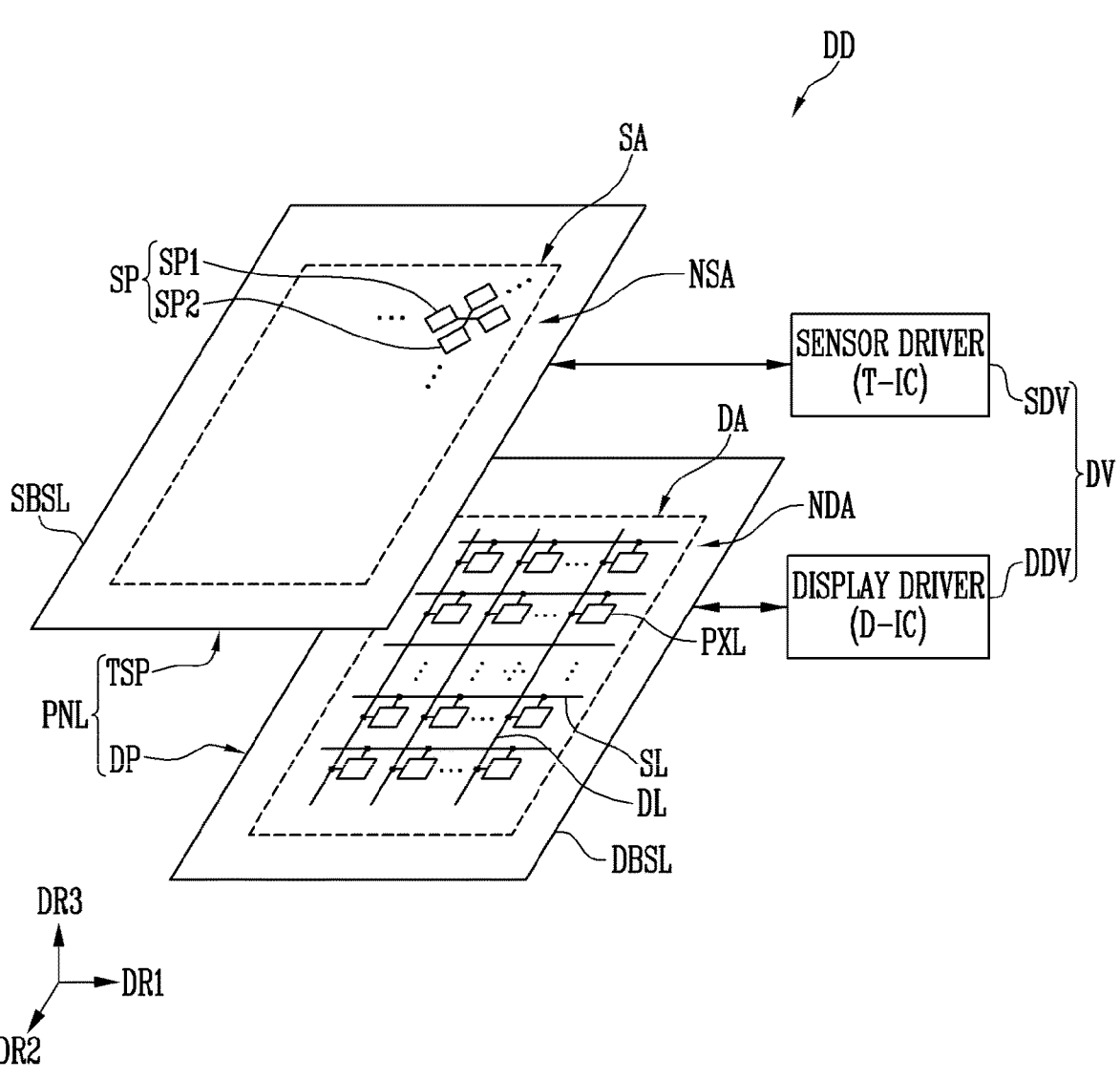
FIG. 1 is a view illustrating a display device according to some embodiments of the present disclosure.
Figure 2:
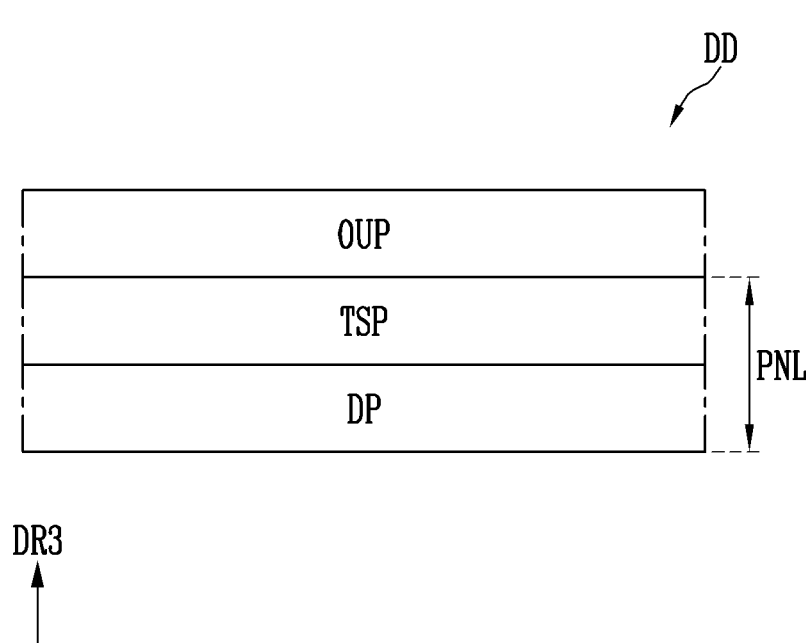
FIG. 2 is a schematic sectional view illustrating a stacked structure of the display device according to some embodiments of the present disclosure.

FIG. 1 is a view illustrating a display device according to some embodiments of the present disclosure. FIG. 2 is a schematic sectional view illustrating a stacked structure of the display device according to some embodiments of the present disclosure.

Referring to FIGS. 1 and 2, the display device DD is configured to provide (or emit) light. The display device DD may include a panel PNL and a driving circuit DV for driving the panel PNL. The display device DD may further include an outer part OUP.

The panel PNL may include a display part DP for displaying an image and a sensor part TSP capable of sensing a user input (e.g., a touch input). The display part DP may be designated as a display panel. The sensor part TSP may be designated as a sensing panel.

The panel PNL may include pixels PXL and sensing electrodes SP. According to some embodiments, the pixels PXL may display an image by using a display frame period as a unit. The sensing electrodes SP may sense an input (e.g., a touch input) of a user by using a sensing frame period as a unit. The sensing frame period and the display frame period may be independent from each other or may be different from each other. The sensing frame period and the display frame period may be synchronized with each other or may be unsynchronized.

The sensor part TST including the sensing electrodes SP may acquire information on a touch input of the user. According to some embodiments of the present disclosure (e.g., a mutual capacitance type), the sensing electrodes SP may include a first sensing electrode SP1 for providing a first sensing signal and a second sensing electrode SP2 for providing a second sensing signal. According to some embodiments, the first sensing electrode SP1 may be a transmitter (Tx) pattern electrode, and the second sensing electrode SP2 may be a receiver (Rx) pattern electrode. According to some embodiments, information on a touch input (or touch event) may mean including the position of a touch which the user is to provide, and the like.

However, embodiments according to the present disclosure are not limited thereto. For example, according to some embodiments of the present disclosure (e.g., in a self-capacitance type), the sensing electrodes SP may be configured with one kind of sensing electrodes without distinguishing the first and second sensing electrodes SP1 and SP2 from each other.

The driving circuit DV may include a display driver DDV for driving the display part DP and a sensor driver SDV for driving the sensor part TSP.

The display part DP may include a display base layer DBSL and pixels PXL provided on the display base layer DBSL. The pixels PXL may be located in a display area DA.

The display base layer DBSL (or the display device DD) may include the display area DA at which images are displayed and a non-display area NDA as an area except the display area DA. According to some embodiments, the display area DA may be located in a central area of the display part DP, and the non-display area NDA may be located adjacent to the periphery of the display area DA.

The display base layer DBSL may be a base substrate or a base member, which is used to support the display device DD. The display base layer DBSL may be a rigid substrate made of glass. Alternatively, the display base layer DBSL may be a flexible substrate which is bendable, foldable, rollable, and the like. The display base layer DBSL may include an insulating material including a polymer resin such as polyimide. However, embodiments according to the present disclosure are not limited thereto.

Scan lines SL and data lines DL, and the pixels PXL connected to the scan lines SL and the data lines DL are located in the display area DA. The pixels PXL may be selected by a scan signal having a turn-on level, which is supplied from the scan lines SL, to be supplied with a data signal from the data lines DL, and emit light with a luminance corresponding to the data signal. Accordingly, images corresponding to the data signal may be displayed in the display area DA. However, in the disclosure, the structure, driving method, and the like of the pixels PXL are not particularly limited.

Various types of lines and/or a built-in circuit, connected to the pixels PXL of the display area DA may be located in the non-display area NDA. For example, a plurality of lines for supplying various power sources and various control signals to the display area DA may be located in the non-display area NDA.

The display part DP may output visual information (e.g., an image). According to some embodiments, the type/kind of the display part DP is not particularly limited. For example, the display part DP may be implemented as a self-luminescent display panel such as an organic light emitting display panel. However, when the display part DP is implemented as a self-luminescent display panel, each pixel is not necessarily limited to a case where the pixel includes only an organic light emitting element. For example, a light emitting element of each pixel may be configured as an organic light emitting diode, an inorganic light emitting diode, a quantum dot/well light emitting diode, or the like. Alternatively, the display part DP may be implemented as a non-light emitting display panel such as a liquid crystal display panel. When the display part DP is implemented as a non-light emitting display panel, the display device DD may additionally include a light source such as a back-light unit.

Hereinafter, for convenience of description, embodiments in which the display part DP is implemented as an organic light emitting display panel will be mainly described.

The sensor part TSP may include a sensor base layer SBSL and a plurality of sensing electrodes SP formed on the sensor base layer SBSL. The sensing electrodes SP may be located in a sensing area SA on the sensor base layer SBSL.

The sensor base layer SBSL (or the display device DD) may include the sensing area SA capable of sensing a touch input or the like and a non-sensing area NSA at the periphery of the sensing area SA. According to some embodiments, the sensing area SA may be arranged to overlap with at least one area of the display area DA. For example, the sensing area SA may be set as an area corresponding to the display area DA (e.g., an area overlapping with the display area DA), and the non-sensing area NSA may be set as an area corresponding to the non-display area NDA (e.g., an area overlapping with the non-display area NDA). When a touch input or the like is provided on the display area DA, the touch input may be detected through the sensor part TSP.

The sensor base layer SBSL may include at least one insulating layer (e.g., a first insulating layer INS1 (see FIG. 4)). For example, the first insulating layer INS1 for forming the sensor base layer SBSL may be located on the display part DP, to form a base for allowing the sensing electrodes SP to be formed thereon. However, the example of forming the sensing base layer SBSL is not particularly limited.

The sensing area SA is set as an area capable of reacting with a touch input (i.e., an active area of sensors). To this end, sensing electrodes SP for sensing a touch input or the like may be located in the sensing area SA.

The sensor part TSP may acquire information on an input provided from the user. The sensor part TSP may recognize a touch input. The sensor part TSP may recognize a touch input by using a capacitive sensing type. The sensor part TSP may sense a touch input by using a mutual capacitance type or sense a touch input by using a self-capacitance type.

According to some embodiments, each of the first sensing electrodes SP1 may extend in a first direction DR1. The first sensing electrodes SP1 may be arranged in a second direction DR2. The second direction DR2 may be different from the first direction DR1. For example, the second direction DR2 may be a direction orthogonal to the first direction DR1. Each of the first sensing electrodes SP1 may have a form in which first cells having a relatively wide area and first bridge electrodes having a relatively narrow area are connected to each other. The first sensing electrodes SP1 may generally have a diamond shape. However, the shape of the first sensing electrodes SP1 is not particularly limited.

According to some embodiments, each of the second sensing electrodes SP2 may extend in the second direction DR2. The second sensing electrodes SP2 may be arranged in the first direction DR1. Each of the second sensing electrodes SP2 may have a form in which second cells having a relatively wide area and second bridge electrodes having a relatively narrow area are connected to each other. The second sensing electrodes SP2 may generally have a diamond shape. However, the shape of the second sensing electrodes SP2 is not particularly limited.

According to some embodiments, the first sensing electrodes SP1 and the second sensing electrodes SP2 may have the same (e.g., the substantially same) shape. For example, the first sensing electrodes SP1 as TX pattern electrodes and the second sensing electrodes SP2 as Rx pattern electrodes may have the substantially same shape, and accordingly, the sensing performance of a touch event in the sensing area SA can be uniformly set.

Meanwhile, sensing lines for electrically connecting the sensing electrodes SP to the sensor driver SDV or the like may be located in the non-sensing area NSA of the sensor part TSP.

The driving circuit DV may include a display driver DDV for driving the display part DP and a sensor driver SDV for driving the sensor part TSP.

The display driver DDV is electrically connected to the display part DP to drive the pixels PXL. The sensor driver SDV is electrically connected to the sensor part TSP to drive the sensor part TSP.

The outer part OUP may be roughly located at an outer portion of the display device DD. The outer part OUP may be located on the sensor part TSP. Light provided from the display part DP may be output to the outside while passing through the outer part OUP.

The outer part OUP may protect internal components of the display device DD from external influence. Also, the outer part OUP may include a total reflection structure TRS (see FIG. 5) in which a light recycling structure is implemented, thereby improving light efficiency. This will be described in detail later.

Figure 3:
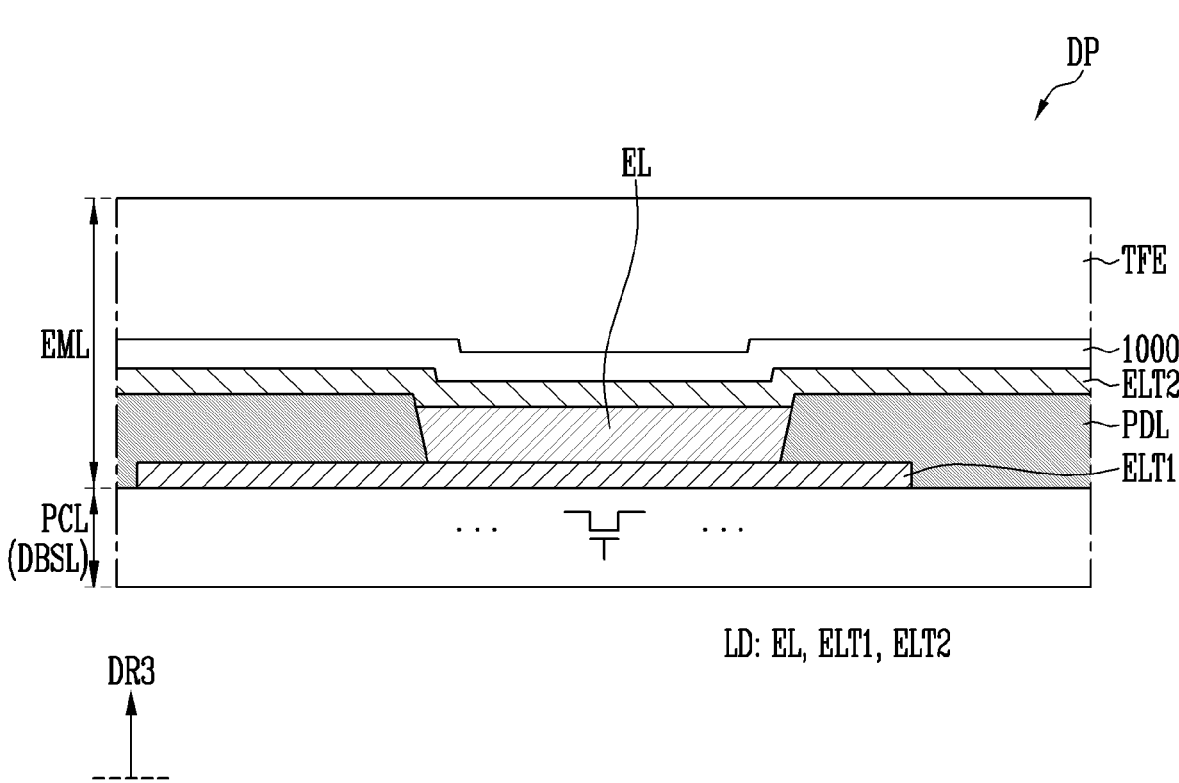
FIG. 3 is a schematic sectional view illustrating a display part according to some embodiments of the present disclosure.

Next, aspects of the display part DP according to some embodiments will be described in more detail with reference to FIG. 3. FIG. 3 is a schematic sectional view illustrating a display part according to some embodiments of the present disclosure.

Referring to FIG. 3, the display part DP may include a pixel circuit layer PCL and a light emitting element layer EML.

The pixel circuit layer PCL may include a pixel circuit for driving light emitting elements LD. The pixel circuit layer PCL may include a display base layer DBSL, conductive layers for forming pixel circuits, and insulating layers located between the conductive layers.

The pixel circuit may include a thin film transistor. The pixel circuit may include a driving transistor. The pixel circuit may be electrically connected to the light emitting elements LD to provide an electrical signal for allowing the light emitting elements LD to emit light.

The light emitting element layer EML may be located on the pixel circuit layer PCL. According to some embodiments, the light emitting element layer EML may include a light emitting element LD, a pixel defining layer PDL, a low reflection inorganic layer 1000, and a thin film encapsulation layer TFE.

The light emitting element LD may be located on the pixel circuit layer PCL. According to some embodiments, the light emitting element LD may include a first electrode ELT1, a light emitting layer EL, and a second electrode ELT2. According to some embodiments, the light emitting layer EL may be located in an area defined by the pixel defining layer PDL. The pixel defining layer PDL may be adjacent to the periphery of the light emitting layer EL. One surface of the light emitting layer EL may be electrically connected to the first electrode ELT1, and the other surface of the light emitting element EL may be electrically connected to the second electrode ELT2.

The first electrode ELT1 may be an anode electrode with respect to the light emitting layer EL, and the second electrode ELT2 may be a common electrode (or cathode electrode) with respect to the light emitting element EL. According to some embodiments, the first electrode ELT1 and the second electrode ELT2 may include a conductive material. For example, the first electrode ELT1 may include a conductive material having reflexibility, and the second electrode ELT2 may include a transparent conductive material. However, embodiments according to the present disclosure are not limited thereto.

The light emitting layer EL may have a multi-layer thin film structure including a light generation layer. The light emitting layer EL may include a hole injection layer for injecting holes, a hole transport layer for increasing a hole recombination opportunity by suppressing movement of electrons which are excellent in transportability of holes and are not combined in a light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons. The light emitting layer EL may release light, based on an electrical signal provided from the first electrode ELT1 and the second electrode ELT2.

The pixel defining layer PDL may be located on the pixel circuit layer PCL, to define a position at which the light emitting layer EL is arranged. The pixel defining layer PDL may include an organic material. According to some embodiments, the pixel defining layer PDL may include at least one selected from the group consisting of acrylic resin, epoxy resin, phenolic resin, polyamide resin, and polyimide resin. However, embodiments according to the present disclosure are not limited thereto.

The low reflection inorganic layer 1000 may be located on the light emitting element LD (e.g., the second electrode ELT2). The low reflection inorganic layer 1000 may be located between the thin film encapsulation layer TFE and the light emitting element LD.

The low reflection inorganic layer 1000 may include an inorganic material. For example, the low reflection inorganic layer 1000 may include at least one of a conductive material, a metal, or a metal compound. For example, the metal may include at least one of aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), or ytterbium (Yb). The metal compound may include at least one selected from the group consisting of silicon oxide ($SiO_x$), titanium oxide ($TiO_x$), zirconium oxide ($ZrO_x$), tantalum oxide ($Ta_xO_y$), hafnium oxide ($HfO_x$), aluminum oxide ($Al_xO_y$), zinc oxide ($ZnO_x$), yttrium oxide ($Y_xO_y$), beryllium oxide ($BeO_x$), magnesium oxide ($MgO_x$), lead oxide ($PbO_x$), tungsten oxide ($WO_x$), silicon nitride ($SiN_x$), lithium fluoride ($LiF_x$), calcium fluoride ($CaF_x$), magnesium ($MgF_x$), and cadmium sulfide ($CdS_x$). The low reflection inorganic layer 1000 may include at least one selected from the above-described materials by considering a refractive index and an absorption coefficient thereof.

The low reflection inorganic layer 1000 may absorb light incident into the display device DD from the outside, and decrease external light reflexibility (or reflection). Accordingly, the low reflection inorganic layer 1000 is included, so that the display quality and visibility of the display device DD can be relatively improved.

The thin film encapsulation layer TFE may be located on the low reflection inorganic layer 1000. The thin film encapsulation layer TFE may cancel a step difference generated by the light emitting element LD, the low reflection inorganic layer 1000, and the pixel defining layer PDL. The thin film encapsulation layer TFE may include a plurality of insulating layers covering the light emitting element LD. According to some embodiments, the thin film encapsulation layer TFE may have a structure in which an inorganic layer and an organic layer are alternately stacked.

Figure 4:
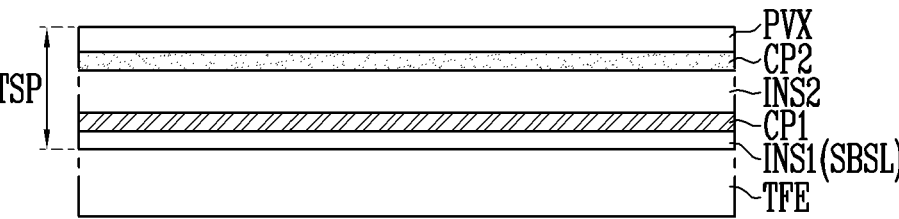
FIG. 4 is a schematic sectional view illustrating a sensing part according to some embodiments of the present disclosure.
Figure 4:

Next, aspects of the sensor part TSP according to some embodiments will be described with reference to FIG. 4. FIG. 4 is a schematic sectional view illustrating a sensing part according to some embodiments of the present disclosure.

Referring to FIG. 4, the sensor part TSP may be located on the thin film encapsulation layer TFE. The sensor part TSP may include a first insulating layer INS1, a first conductive pattern CP1, a second insulating layer INS2, a second conductive pattern CP2, and a protective layer PVX.

According to some embodiments, the first conductive pattern CP1 and the second conductive pattern CP2 are patterned at one position, to form sensing electrodes SP. For example, a portion of each of the first conductive pattern CP1 and the second conductive pattern CP2 may constitute a first sensing electrode SP1, and a portion of the second conductive pattern CP2 may constitute a second sensing electrode SP2. However, embodiments according to the present disclosure are not limited thereto.

The first insulating layer INS1 may be located on the thin film encapsulation layer TFE. The first insulating layer INS1 may form a sensor base layer SBSL, thereby providing an area in which the first conductive pattern CP1, the second insulating layer INS2, the second conductive pattern CP2, and the protective layer PVX are located.

The first conductive pattern CP1 may be located on the first insulating layer INS1. The second conductive pattern CP2 may be located on the second insulating layer INS2. The first conductive pattern CP1 and the second conductive pattern CP2 may be spaced apart from each other with the second insulating layer INS2 interposed therebetween.

The first conductive pattern CP1 and the second conductive pattern CP2 may include a single- or multi-layer metal layer. The first conductive pattern CP1 and the second conductive pattern CP2 may include at least one of various metal materials including gold (Au), silver (Ag), aluminum (Al), molybdenum (Mo), chromium (Cr), titanium (Ti), nickel (Ni), neodymium (Nd), copper (Cu), platinum (Pt), and the like, or alloys thereof. According to some embodiments, the first conductive pattern CP1 and the second conductive pattern CP2 may include at least one of various transparent conductive materials including one of silver nano wire (AgNW), Indium Tin Oxide (ITO), Indium Zinc Oxide (IZO), Indium Gallium Zinc Oxide (IGZO), Antimony Zinc Oxide (AZO), Indium Tin Zinc Oxide (ITZO), Zinc Oxide (ZnO), Tin Oxide ($SnO_2$), carbon nano tube, graphene, and the like.

The second insulating layer INS2 may be located on the first conductive pattern CP1. The second insulating layer INS2 may be interposed between the first conductive pattern CP1 and the second conductive pattern CP2. The protective layer PVX may be located on the second conductive pattern CP2.

The first insulating layer INS1 and the second insulating layer INS2 may include an inorganic material. The inorganic material may include at least one selected from the group consisting of silicon nitride ($SiN_x$), silicon oxide ($SiO_x$), silicon oxynitride ($SiO_xN_y$), and aluminum oxide ($AlO_x$). The protective layer PVX may include an organic material. The organic material may include at least one of an acryl-based resin, methacryl-based resin, polyisoprene, vinyl-based resin, epoxy-based resin, urethane-based resin, cellulose-based resin, siloxane-based resin, polyimide-based resin, polyamide-based resin, or perylene-based resin. However, embodiments according to the present disclosure are not limited thereto.

Hereinafter, a structural feature including a light efficiency improvement structure as a stacked structure of the display device DD according to some embodiments of the present disclosure will be described with reference to FIGS.

5 to 11. In FIGS. 5 to 11, descriptions of portions overlapping with the above-described portions will be simplified or will not be repeated.

Figure 5:
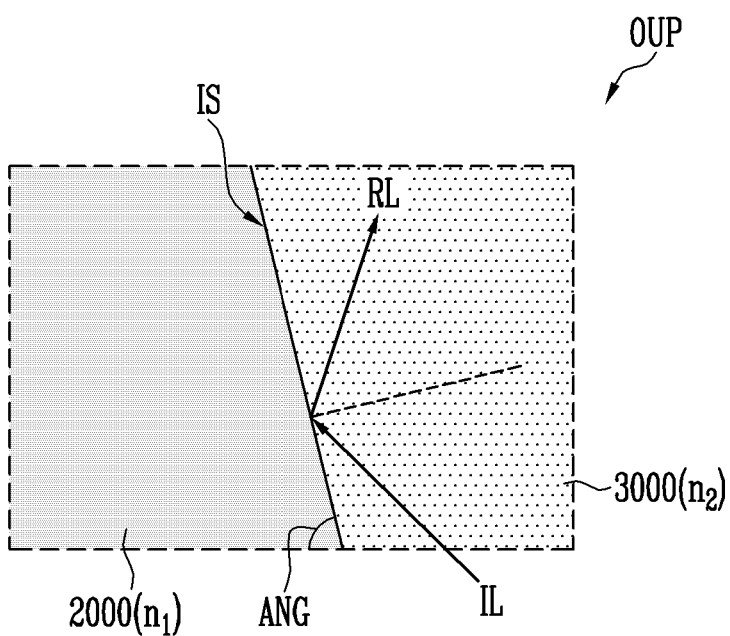
FIG. 5 is a schematic view illustrating an outer part including a total reflection structure according to some embodiments of the present disclosure.
Figure 10:
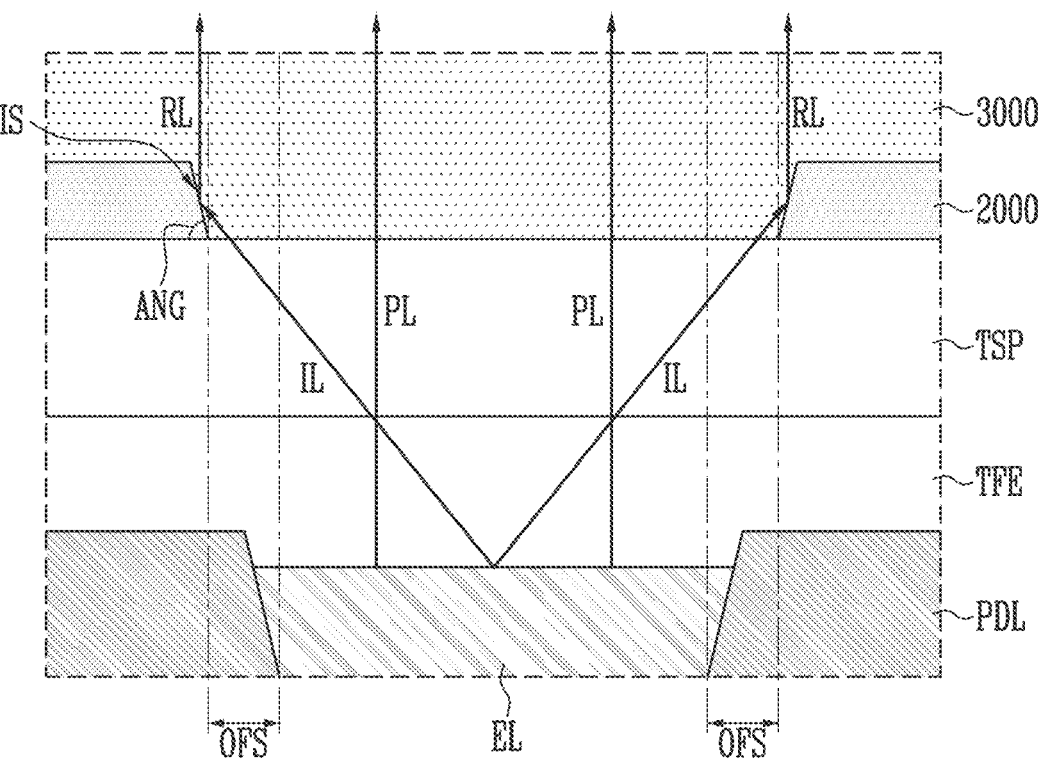
FIG. 10 is a schematic sectional view illustrating a total reflection structure according to some embodiments of the present disclosure.
Figure 11:
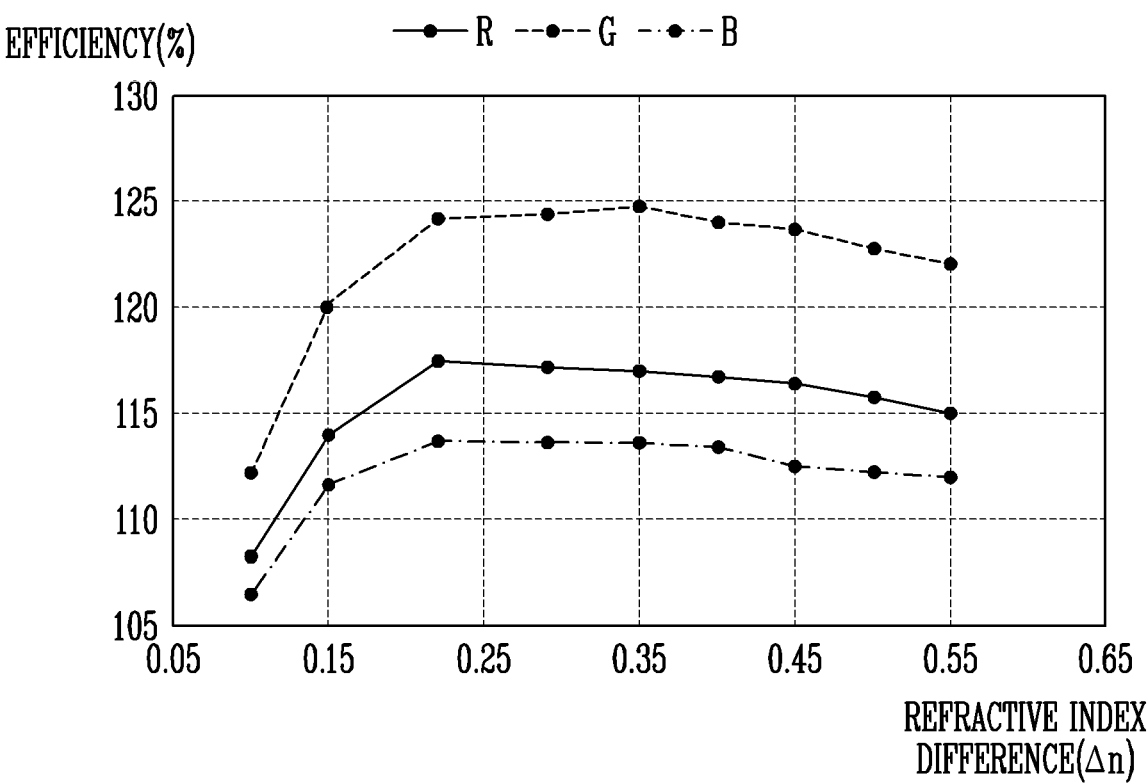
FIG. 11 is a graph illustrating an efficiency improvement effect of the total reflection structure according to some embodiments of the present disclosure.

FIG. 5 is a schematic view illustrating an outer part including a total reflection structure according to some embodiments of the present disclosure. FIGS. 6 to 9 are schematic sectional views of a display device according to some embodiments of the present disclosure. FIG. 10 is a schematic sectional view illustrating a total reflection structure according to some embodiments of the present disclosure. FIG. 11 is a graph illustrating an efficiency improvement effect of the total reflection structure according to some embodiments of the present disclosure.

First, referring to FIG. 5, a total reflection structure TRS according to some embodiments of the present disclosure will be described.

The total reflection structure TRS may be located outward of the light emitting element layer EML with respect to a display direction of the display device DD (e.g., a third direction DR3).

At least a portion of light emitted from the light emitting element LD may be applied to the total reflection structure TRS, and the applied light may be recycled to be released to the outside of the display device DD.

The total reflection structure TRS may include a first layer 2000 having a first refractive index $n_1$ and a second layer having a second refractive index $n_2$ higher than the first refractive index $n_1$.

The first layer 2000 and the second layer 3000 may form an interface IS. According to some embodiments, incident light IL applied to the second layer 3000 (e.g., roughly applied from the bottom to the top) may be reflected at (or from) the interface IS. Accordingly, reflected light RL reflected at the interface IS may roughly face upwardly.

The first layer 2000 may include a material having a low refractive index as compared with the second layer 3000. According to some embodiments, the first layer 2000 may include a low refractive material, thereby implementing a pattern structure having a relatively low refractive index.

According to some embodiments, the first layer 2000 may include a light absorbing material. The light absorbing material may include a color material including at least one of carbon black or lactam black. However, embodiments according to the present disclosure are not limited thereto, and the light absorbing material may be implemented with various materials.

Also, the first layer 2000 may further include a binder, an initiator, an additive, and the like, in addition to the light absorbing material. The example in which the binder, the initiator, and the additive, which are used to form the first layer 2000, are applied is not particularly limited.

According to some embodiments, the first layer 2000 may further include a low refractive material for implementing a low refraction structure.

For example, the first layer 2000 may include a monomer including a fluorine-based functional group for low refraction. The monomer including the fluorine-based functional group may be copolymerized with an additional material (e.g., a binder) included in the first layer 2000, thereby decreasing the refractive index of the first layer 2000.

According to some embodiments, the monomer for low refraction may further include a fluorine-based functional group and an additional functional group bounded thereto. According to some embodiments, the monomer including the fluorine-based function group may be an epoxy-based material including the fluorine-based functional group or an acrylic-based material including the fluorine-based functional group.

For example, the monomer including the fluorine-based function group may include at least one selected from the group consisting of 3-(perfluorohexyl)propyl epoxide, octafluoropentyl methacrylate, and heptadecafluorodecyl methacrylate.

According to some embodiments, the monomer including the fluorine-based functional group may be included by 5 wt % (weight %) to 20 wt % with respect to a solid content of a mixed material forming the first layer 2000. For example, the monomer including the fluorine-based functional group may be included by 7.5 wt % to 15 wt % with respect to the solid content of the mixed material forming the first layer 2000.

According to some embodiments, when the monomer including the fluorine-based functional group is included less than 5 wt %, the low refraction of the first layer 2000 may not be sufficiently made. When the monomer including the fluorine-based functional group is included greater than 20 wt %, compatibility with a dispersant included in a photoresist used when the first layer 2000 is manufactured is decreased, and therefore, the stability of the photoresist may be damaged. In addition, it may be difficult to appropriately form the first layer 2000. According to some embodiments, the content of the monomer including the fluorine-based functional group may be adjusted, so that the low refraction can be sufficiently made, and, simultaneously, process stability can be ensured.

Alternatively, for example, the first layer 2000 may include a nano particle for low refraction, and the nano particle may be copolymerized with an additional material (e.g., a binder) included in the first layer 2000, thereby decreasing the refractive index of the first layer 2000. According to some embodiments, the nano particle may include hollow particles having different diameters, thereby decreasing the refractive index of the first layer 2000.

According to some embodiments, the nano particle may be a hollow silica particle, a hollow alumina particle, a hollow resin particle, or any combination thereof. According to some embodiments, the nano particle may include silicon oxide (SiOx) implemented with hollow particles. However, embodiments according to the present disclosure are not limited thereto.

According to some embodiments, the display device DD may include the total reflection structure TRS configured to reflect light, and accordingly, the light efficiency of the display device DD can be relatively improved.

The total reflection structure TRS may include at least some structures of the outer part OUP. For example, the first layer 2000 may overlap with the first conductive pattern CP1 and the second conductive pattern CP2, which are used to implement the sensor part TSP, in a plan view, such that the first conductive pattern CP1 and the second conductive pattern CP2 are not viewed from the outside. In addition, for example, the second layer 3000 may correspond to various structures forming the interface IS with the first layer 2000.

Aspects of some embodiments of the total reflection structure TRS and the stacked structure of the display device DD including the same will be described in conjunction with FIGS. 6 to 9.

First, a display device DD including a total reflection structure TRS according to some embodiments of the present disclosure will be described with reference to FIG. 6.

Figure 6:
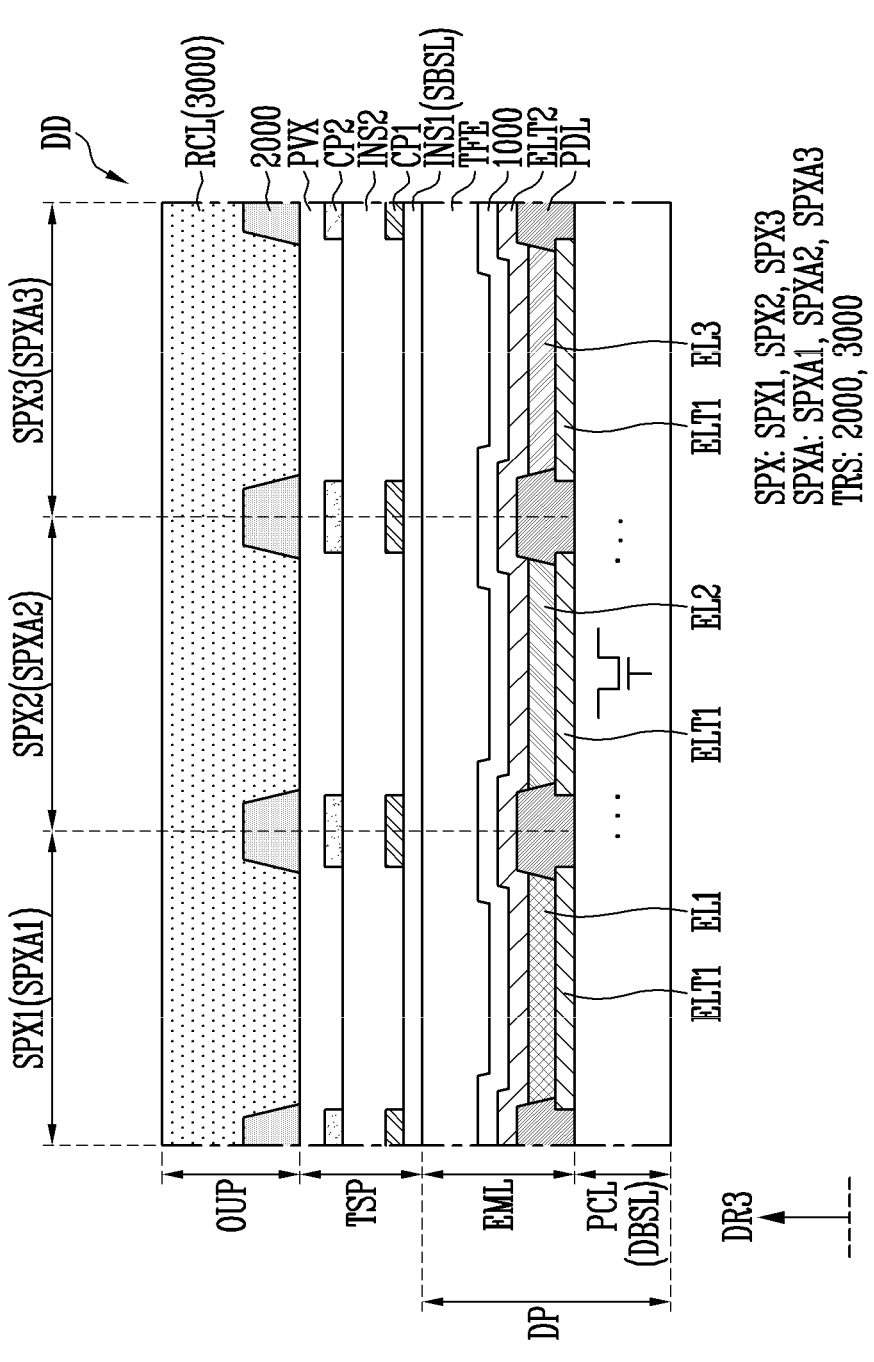
FIGS. 6 to 9 are schematic sectional views of a display device according to some embodiments of the present disclosure.

Referring to FIG. 6, the display device DD according to some embodiments of the present disclosure may include first to third light emitting layers EL1, EL2, and EL3 emitting lights of different colors.

For example, the display device DD may include sub-pixels SPX1, SPX2, and SPX3 each forming a sub-pixel area SPXA. The sub-pixel areas SPXA may include a first sub-pixel area SPXA1 as an area formed by the first sub-pixel SPX1, in which light of a first color is emitted, a second sub-pixel area SPXA2 as an area formed by the second sub-pixel SPX2, in which light of a second color is emitted, and a third sub-pixel area SPXA3 as an area formed by the third sub-pixel SPX3, in which light of a third color is emitted.

The first light emitting layer EL1 may form a first light emitting element emitting light of the first color, the second light emitting layer EL2 may form a second light emitting element emitting light of the second color, and the third light emitting layer EL3 may form a third light emitting element emitting light of the third color.

According to some embodiments, the first conductive pattern CP1 and the second conductive pattern CP2 in the sensor part TSP may be located in different layers, to form a structure of sensing electrodes SP.

The outer part OUP may be located on the sensor part TSP. The outer part OUP may be located outward of the first conductive pattern CP1 and the second conductive pattern CP2, which form the sensing electrodes SP.

The outer part OUP may include a first layer 2000 and a second layer 3000. According to some embodiments, the second layer 3000 may be a reflection control layer RCL.

The first layer 2000 may be covered by the reflection control layer RCL, and be located on the sensor part TSP.

The first layer 2000 may overlap with the first conductive pattern CP1 in a plan view. The first layer 2000 may overlap with the second conductive pattern CP2 in a plan view. The first layer 2000 may cover the first conductive pattern CP1 and the second conductive pattern CP2 in a plan view.

The first layer 2000 covers the first conductive pattern CP1 and the second conductive pattern CP2, which form the sensing electrodes SP, thereby improving the external visibility of the display device DD.

The first layer 2000 may overlap with the pixel defining layer DPL in a plan view. The first layer 2000 may be located between adjacent sub-pixel areas SPXA in a plan view. The first layer 2000 may distinguish adjacent sub-pixel areas SPXA from each other between the adjacent sub-pixel areas SPXA.

The reflection control layer RCL may form the second layer 3000. The reflection control layer RCL may form an interface IS with the first layer 2000. The reflection control layer RCL may cancel a step difference caused as the first layer 2000 is formed.

The reflection control layer RCL may include various materials. According to some embodiments, the reflection control layer RCL may include a dye, a pigment or a combination thereof. For example, the reflection control layer RC may include at least one selected from the group consisting of an oxazine-based compound, a cyanine-based compound, a tetrazoporphin-based compound, and a squarylium-based compound, but embodiments according to the present disclosure are not limited thereto.

The reflection control layer RCL may have a refractive index higher than a refractive index of at least the first layer 2000. Accordingly, light reflection may occur at the interface IS between the reflection control layer RCL and the first layer 2000.

According to some embodiments, the reflection control layer RCL may include a nano particle (e.g., may be a nano particle of which average particle diameter is 50 nm or less) to sufficiently have a refractive index difference of the reflection control layer RCL with the first layer 2000. For example, the reflection control layer RCL may include at least one selected from the group consisting of zirconium oxide ($ZrO_x$), titanium oxide ($TiO_x$), and zinc oxide (ZnO).

Next, the display device DD including a total reflection structure TRS according to some embodiments of the present disclosure will be described with reference to FIG. 7.

Figure 7:
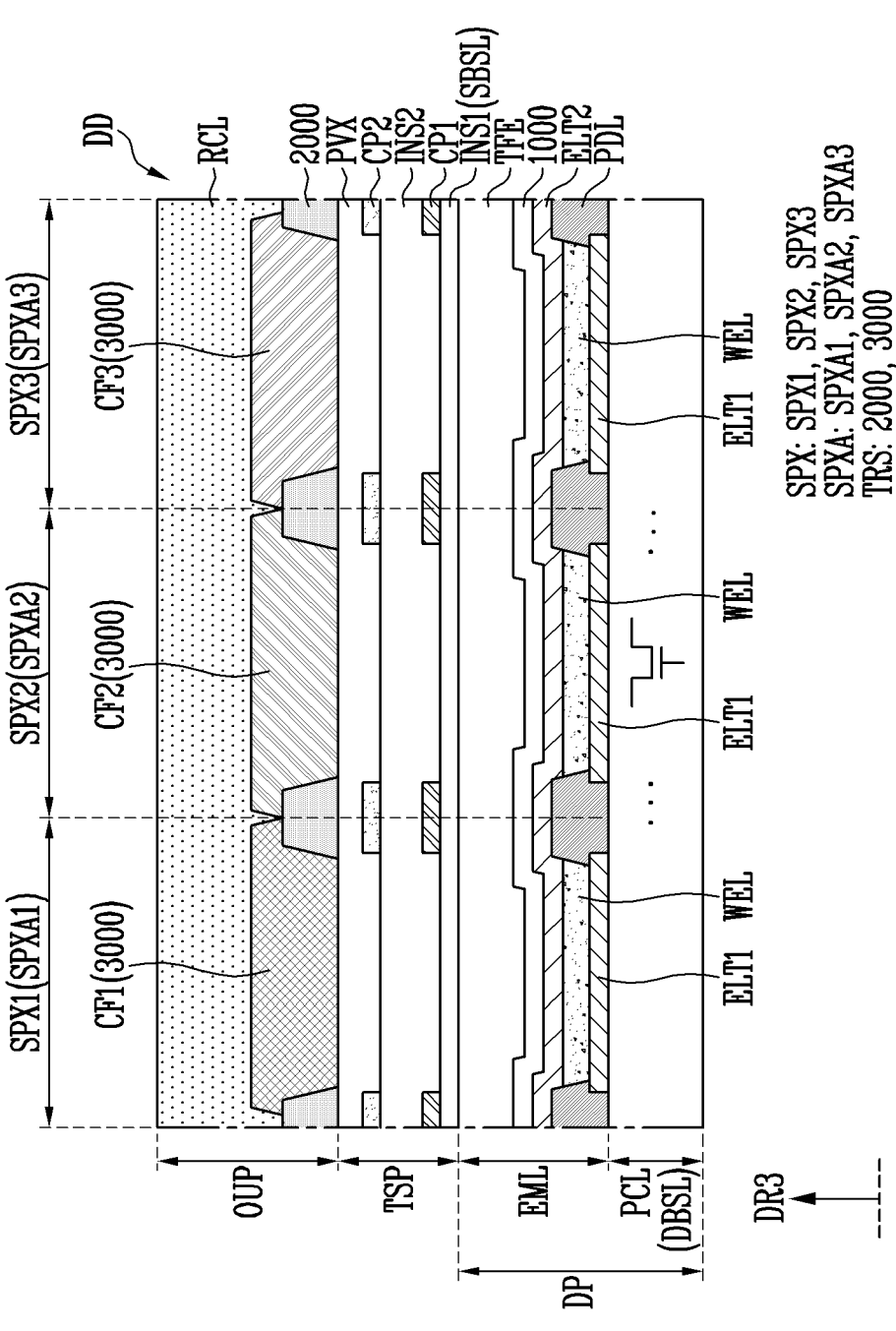

Referring to FIG. 7, a display device DD according to some embodiments of the present disclosure may include a white light emitting layer WEL emitting light of the same white. For example, the above-described light emitting layer EL may be a white light emitting layer WEL configured to emit white light.

The white light emitting layer WEL may be located in each of the first to third sub-pixels SPX1, SPX2, and SPX3. According to some embodiments, the display device DD (e.g., the outer part OUP) may further include color filters CF1, CF2, and CF3. According to some embodiments, the color filters CF1, CF2, and CF3 which emit white light and accord with colors of the respective first to third sub-pixels SPX1, SPX2, and SPX3 are located, so that a full-color image can be displayed.

A first color filter CF1 is a color filter for forming the first sub-pixel SPX1, and may overlap with the first sub-pixel area SPXA1 in a plan view. The first color filter CF1 may allow light of a first color to be selectively transmitted therethrough. The first color filter CF1 may be a red color filter, and include a red color filter material.

A second color filter CF2 is a color filter for forming the second sub-pixel SPX2, and may overlap with the second sub-pixel area SPXA2 in a plan view. The second color filter CF2 may allow light of a second color to be selectively transmitted therethrough. The second color filter CF2 may be a green color filter, and include a green color filter material.

A third color filter CF3 is a color filter for forming the third sub-pixel SPX3, and may overlap with the third sub-pixel area SPXA3 in a plan view. The third color filter CF3 may allow light of a third color to be selectively transmitted therethrough. The third color filter CF3 may be a blue color filter, and include a blue color filter material.

According to some embodiments, the color filters CF1, CF2, and CF3 may form a second layer 3000. For example, the color filters CF1, CF2, and CF3 may form an interface IS with a first layer 2000, and light may be totally reflected between the color filters CF1, CF2, and CF3 and the first layer 2000. In addition, a reflection control layer RCL may be formed on the color filters CF1, CF2, and CF3.

Next, a display device DD including a total reflection structure TRS according to some embodiments of the present disclosure will be described with reference to FIG. 8.

Figure 8:
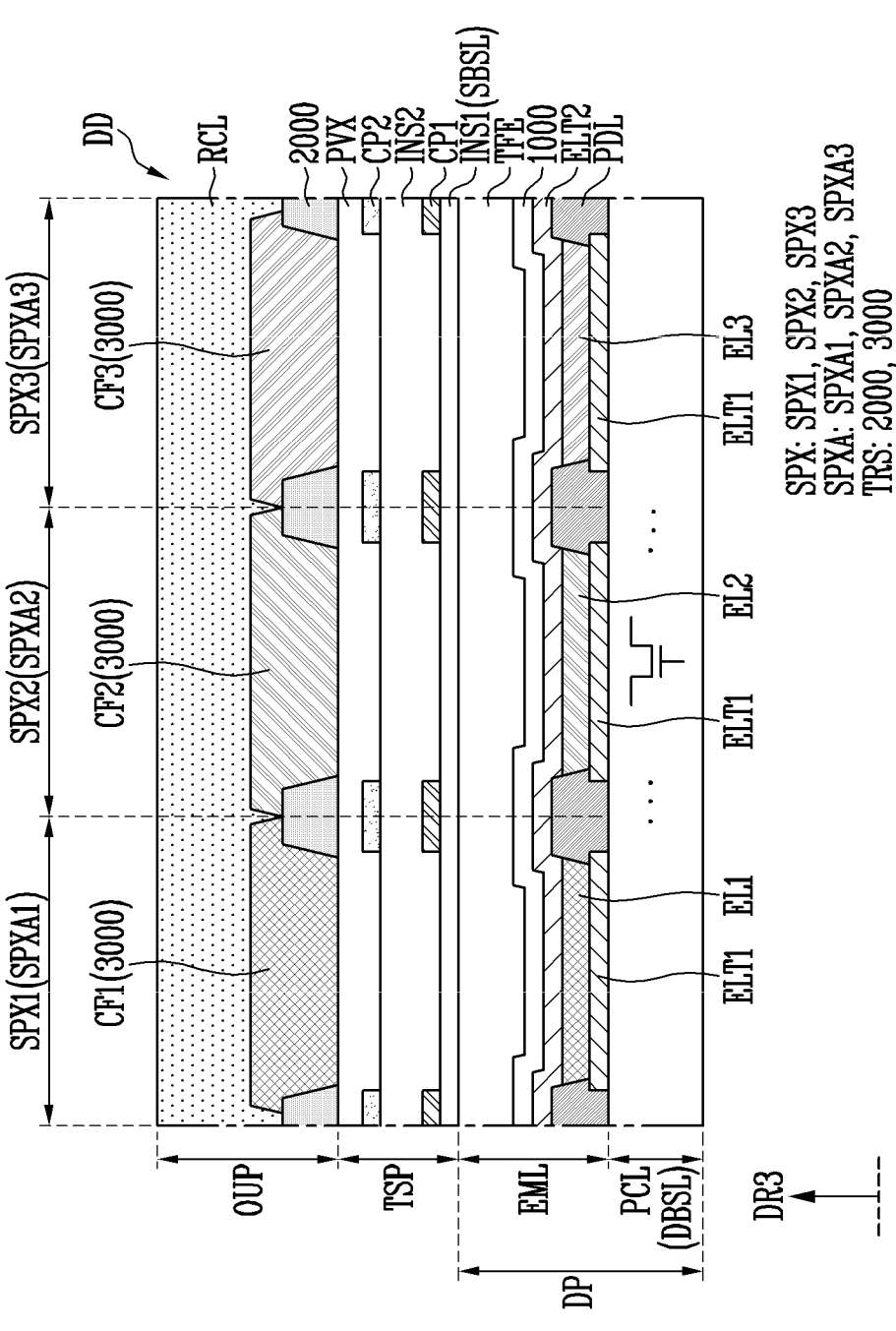

Referring to FIG. 8, the display device DD according to some embodiments of the present disclosure is different from the display device DD described above with reference to FIG. 7, in that first to third light emitting layers EL1, EL2, and EL3 are formed in the respective first to third sub-pixels SPX1, SPX2, and SPX3.

For example, light emitting elements LD provided in the respective first to third sub-pixels SPX1, SPX2, and SPX3 may emit lights of different colors, and each of the first to third sub-pixels SPX1, SPX2, and SPX3 may emit light of one color.

Next, a display device DD including a total reflection structure TRS according to some embodiments of the present disclosure will be described with reference to FIG. 9.

Figure 9:
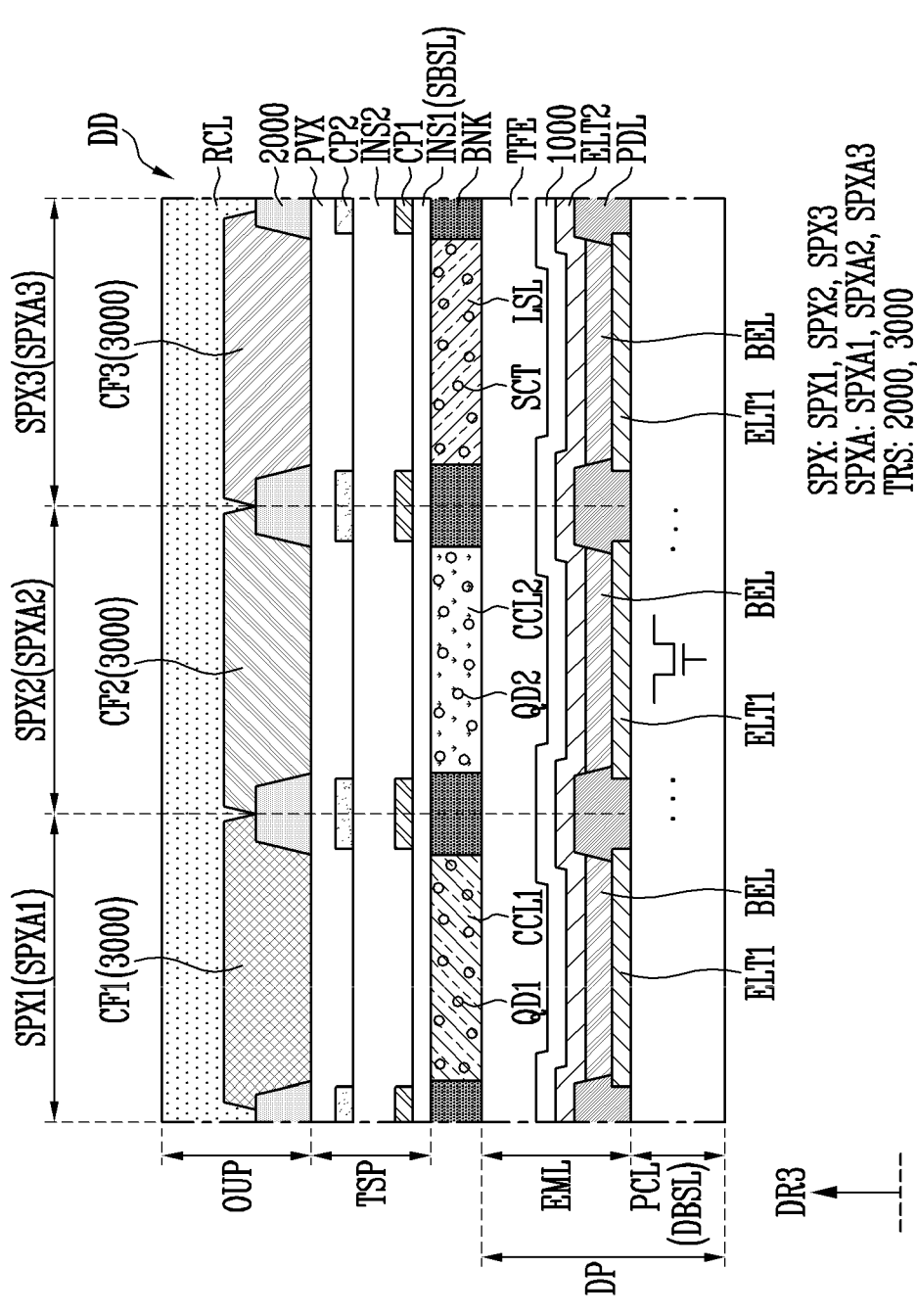

Referring to FIG. 9, the display device DD according to some embodiments of the present disclosure is different from the display device DD described above with reference to FIG. 7, in that color conversion layers CCL1 and CCL2 are further included, and light emitting layers EL are implemented with a blue light emitting layer BEL.

For example, each of the light emitting layers EL is a blue light emitting layer BEL, and each of light emitting elements LD in each of the sub-pixels SPX1, SPX2, and SPX3 may emit blue light. According to some embodiments, color filters CF1, CF2, and CF3, color conversion layers CCL1 and CCL2, and a light scattering layer LSL, which emit blue light and accord with colors of the respective first to third sub-pixels SPX1, SPX2, and SPX3 are located, so that a full-color image can be displayed.

The color conversion layers CCL1 and CCL2 may be configured to change the wavelength of light. The color conversion layers CCL1 and CCL2 and the light scattering layer LSL may be located downward of the color filters CF1, CF2, and CF3. The color conversion layers CCL1 and CCL2 and the light scattering layer LSL may be located between the color filters CF1, CF2, and CF3 and the light emitting element layer EML. The color conversion layers CCL1 and CCL2 and the light scattering layer LSL may be located (or patterned) in an area surrounded by a bank BNK protruding in a thickness direction of the display base layer DBSL (e.g., the third direction DR3).

A first color conversion layer CCL1 may include first color conversion particles for converting light of a third color (e.g., blue) emitted from the blue light emitting layer BEL into light of a first color (e.g., red). For example, the first color conversion layer CCL1 may include a plurality of first quantum dots QD1 dispersed in a matrix material (e.g., a predetermined matrix material) such as base resin. The first quantum dot QD1 may absorb blue light and emit red light by shifting a wavelength of the blue light according to energy transition.

A second color conversion layer CCL2 may include second color conversion particles for converting light of the third color (e.g., blue) emitted from the blue light emitting layer BEL into light of a second color (e.g., green). For example, the second color conversion layer CCL2 may include a plurality of second quantum dots QD2 dispersed in a matrix material (e.g., a predetermined matrix material) such as base resin. The second quantum dot QD2 may absorb blue light and emit green light by shifting a wavelength of the blue light according to energy transition.

According to some embodiments, light of blue having a relatively short wavelength in a visible light band is incident into the first quantum dot QD1 and the second quantum dot QD2, so that absorption coefficients of the first quantum dot QD1 and the second quantum dot QD2 can be increased. Accordingly, the efficiency of light finally emitted from the first pixel PXL1 and the second pixel PXL2 can be improved, and excellent color reproduction can be ensured.

The light scattering layer LSL may be provided to efficiently use light of the third color (e.g., blue) emitted from the blue light emitting layer BEL. For example, the light scattering layer LSL may include a light scattering particle SCT. In an example, the light scattering particle SCT of the light scattering layer LSL may include at least one selected from the group consisting of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). Meanwhile, the light scattering particle SCT is not located in only the third sub-pixel SPX3, and may be selectively included in the first color conversion layer CCL1 or the second color conversion layer CCL2. According to some embodiments, the light scattering particle may be omitted such that the light scattering layer LSL configured with transparent polymer is provided.

Next, a structural feature of a display device DD including a total reflection structure TRS according to some embodiments of the present disclosure will be described with reference to FIG. 10.

According to some embodiments, light emitted by a light emitting layer EL may include incident light IL applied to the total reflection structure TRS to be provided as reflected light RL and output light PL output to the outside without being applied to the total reflection structure TRS. The light emitted by the light emitting layer EL is recycled, so that the light emission efficiency of the display device DD can be maximized.

According to some embodiments, the first layer 2000 and the pixel defining layer PDL may form an offset OFS such that total reflection can efficiently occur between the first layer 2000 and the second layer 3000.

For example, the pixel defining layer PDL may protrude outward of the first layer 2000 in a plan view. A protrusion width of the pixel defining layer PDL protruding as compared with the first layer 2000 may correspond to a size of the offset OFS.

Because the light emitting layer EL is located in an opening formed by the pixel defining layer PDL, the light emitting element EL may be located within a position at which the pixel defining layer PDL is not formed.

According to some embodiments, because the light emitting layer EL forms the offset OFS with respect to the first layer 2000, light (e.g., the incident light IL) emitted from the light emitting layer EL may be applied to an interface IS between the first layer 2000 and the second layer 3000.

For example, when the light emitting layer EL does not form the offset OFS, a portion of the light emitted from the light emitting layer EL may be directly applied to a lower layer of the first layer 2000 instead of the interface IS. However, when the offset OFS is formed, a large amount of light is applied to the interface IS, so that the ratio of the incident light IL and the output light PL can be increased. Accordingly, the light emission efficiency of the display device DD can be improved.

According to some embodiments, the offset OFS may have a length of 0.5 μm to 4.5 μm. According to some embodiments, the offset OFS may have a length of 1.5 μm to 3.5 μm.

According to some embodiments, when the length of the offset OFS is excessively increased, the size of a light emitting area defined by the light emitting layer EL may be reduced. When the length of the offset OFS is excessively decreased, the ratio of light applied to the interface IS is decreased, and therefore, the effect of light recycling may be decreased. Accordingly, when the length of the offset OFS satisfies the above-described numerical range, the light emission efficiency improvement effect of the display device DD can be maximized.

According to some embodiments, a side surface of the first layer 2000 may form an angle ANG with respect to a base surface (e.g., the display base layer DBSL, the sensor base layer SBSL, or the sensor part TSP) on which the first layer 2000 is formed. The side surface of the first layer 2000 may be formed inclined with respect to the base surface (e.g., the display base layer DBSL, the sensor base layer SBSL, or the sensor part TSP) on which the first layer 2000 is formed.

According to some embodiments, the angle ANG may be at least greater than 45 degrees. The angle ANG may be smaller than or equal to 90 degrees. For example, the angle ANG may be 70 degrees to 90 degrees. According to some embodiments, the angle ANG may be 75 degrees to 80 degrees. According to some embodiments, when the angle ANG is smaller than 70 degrees, it may be difficult for the reflected light RL to be viewed at the outside of the display device DD.

According to some embodiments, the side surface of the first layer 2000 may be formed roughly inclined, and accordingly, the incident light IL is totally reflected at the interface IS to be provided as reflected light RL. The reflected light RL may roughly face in the display direction (e.g., the third direction DR3) of the display device DD.

Next, a light emission efficiency improvement feature of a display device DD including a total reflection structure TRS according to some embodiments of the present disclosure will be described with reference to FIG. 11.

FIG. 11 illustrates ratio of light emission efficiency of a display device DD including a total reflection structure TSR according to some embodiments of the present disclosure with respect to light emission efficiency of a comparative display device not including the total reflection structure TRS. The comparative display device is different from the display device DD according to some embodiments of the present disclosure, only in that the comparative display device does not include the total reflection structure TSR.

A graph shown in FIG. 11 illustrates ratio of light emission efficiency according to refractive index difference between the first layer 2000 and the second layer 3000 in the total reflection structure TRS according to some embodiments of the present disclosure. In the graph shown in FIG. 11, the x-axis represents refractive index difference $\Delta n$ between first refractive index $n_1$ of the first layer 2000 and second refractive index $n_2$ of the second layer 3000 in the display device DD according to some embodiments of the present disclosure. In the graph shown in FIG. 11, the y-axis represents ratio of magnitude of light emission of the display device DD including the total reflection structure TRS with respect to light emission of the comparative display device not including the total reflection structure TRS.

In this experiment, magnitudes of light emission of the display device DD according to some embodiments of the present disclosure and the comparative display device were measured while varying the refractive index difference $\Delta n$ between the first refractive index $n_1$ of the first layer 2000 and the second refractive index $n_2$ of the second layer 3000 in the display device DD according to some embodiments of the present disclosure.

In this experiment, a black matrix in which low refraction was not made was located at a position corresponding to the first layer 2000 in the comparative display device, and accordingly, magnitudes of light emission of the comparative display device were measured.

The light emission in the display device DD according to some embodiments of the present disclosure and the comparative display device was measured using a simulation tool (Manufacturer: Synopsys, Product Name: LightTools) known in the art.

Refractive index differences $\Delta n$ between the first refractive index $n_1$ of the first layer 2000 and the second refractive index $n_2$ of the second layer 3000, which are used in the display device DD according to some embodiments of the present disclosure, was included in the following Table 1. A ratio of light emission of the display device DD according to some embodiments of the present disclosure with respect to light emission of the comparative display device for each refractive index difference Δn were included in the following Table 1. In addition, light emission measurements in the display device DD according to some embodiments of the present disclosure and the comparative display device were performed in each of when red light R was emitted, when green light G was emitted, and when blue light B was emitted.

TABLE 1

| Δn | Efficiency (%) | | |
| | R | G | B |
| --- | --- | --- | --- |
| 0.1 | 108.3 | 112.2 | 106.5 |
| 0.15 | 114.0 | 120.2 | 111.6 |
| 0.22 | 117.4 | 124.1 | 113.7 |
| 0.29 | 117.2 | 124.4 | 113.6 |
| 0.35 | 117.0 | 124.8 | 113.6 |
| 0.40 | 116.7 | 124.0 | 113.4 |
| 0.45 | 116.4 | 123.7 | 112.5 |
| 0.50 | 115.8 | 122.8 | 112.2 |
| 0.55 | 115.0 | 122.0 | 112.0 |

Referring to Table 1 and FIG. 11, it can be seen that the light emission efficiency of the display device DD according to some embodiments of the present disclosure is improved as compared with the comparative display device. This may mean that, as the display device DD includes the total reflection structure TRS, the light efficiency of the display device DD is improved.

Meanwhile, the refractive index difference Δn between the first layer 2000 and the second layer 3000 may be preferably determined as 0.55 or less. For example, as the refractive index difference Δn is increased, total reflection may greatly occur at the interface IS between the first layer 2000 and the second layer 3000. However, when the total sum of the first refractive index $n_1$ of the first layer 2000 and the second refractive index $n_2$ of the second layer 3000 is increased, the magnitude of external light reflection is increased, and therefore, the light emission efficiency of the display device DD may be damaged.

Accordingly, experimentally, the refractive index difference Δn may be preferably 0.1 to 0.55. According to some embodiments, the refractive index difference Δn may be 0.15 to 0.55. In conjunction with Table 1 and FIG. 11, when the refractive index difference Δn satisfies the above-described numerical range, the light emission efficiency of the display device DD can be further improved.

According to some embodiments of the present disclosure, there can be provided a display device having relatively improved light efficiency.

Aspects of some embodiments have been described and illustrated herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims, and their equivalents.

What is claimed is:

1. A display device comprising:
a display part;
an outer part on the display part,
wherein the outer part includes a first layer and a second layer forming an interface with the first layer, and
wherein a refractive index of the first layer is lower than a refractive index of the second layer; and
wherein the first layer includes a light absorbing material and a low refractive material.

2. The display device of claim 1, further comprising a sensing part between the display part and the outer part, the sensing part including conductive patterns,
wherein the conductive patterns form sensing electrodes configured to sense a user input, and
wherein the first layer overlaps with the conductive patterns in a plan view.

3. The display device of claim 2, wherein the display part includes organic light emitting elements and a thin film encapsulation layer on the organic light emitting elements, and
wherein the sensing part is on the thin film encapsulation layer.

4. The display device of claim 3, further comprising a low reflection inorganic layer between the organic light emitting elements and the thin film encapsulation layer.

5. The display device of claim 1, further comprising sub-pixels forming sub-pixel areas while each is configured to emit light of one color,
wherein, in a plan view, the first layer overlaps with an area between the sub-pixel areas.

6. The display device of claim 1, wherein the low refractive material includes a monomer including a fluorine-based functional group.

7. The display device of claim 6, wherein the monomer includes at least one selected from the group consisting of 3-(perfluorohexyl) propyl epoxide, octafluoropentyl methacrylate, and heptadecafluorodecyl methacrylate.

8. The display device of claim 6, wherein the monomer is included by 5 wt % to 20 wt % with respect to a solid content of a material forming the first layer.

9. The display device of claim 1, wherein the low refractive material includes nano particles including hollow particles.

10. The display device of claim 1, wherein the second layer is a reflection control layer including a dye, a pigment, or a combination thereof.

11. The display device of claim 1, wherein the second layer is a color filter configured to allow light of one color to be selectively transmitted therethrough.

12. The display device of claim 1, further comprising sub-pixels forming sub-pixel areas while each is configured to emit light of one color,
wherein, in the display part, the sub-pixels include light emitting elements are configured to emit light of different colors.

13. The display device of claim 1, further comprising sub-pixels forming sub-pixel areas while each is configured to emit light of one color,
wherein, in the display part, the sub-pixels include light emitting elements are configured to emit light of a same color.

14. The display device of claim 1, wherein the display part includes a display base layer, and
wherein a side surface of the first layer is formed inclined to form an angle with respect to the display base layer.

15. The display device of claim 14, wherein the angle is in a range of 70 degrees to 90 degrees.

16. The display device of claim 1, wherein the display part includes a light emitting layer and a pixel defining layer defining a position of the light emitting layer, and wherein the pixel defining layer overlaps with the first layer in a plan view, and protrudes from the first layer to form an offset.

17. The display device of claim 1, wherein a difference between the refractive index of the first layer and the refractive index of the second layer is in a range of 0.10 to 0.55.

18. An electronic device comprising:

the display device of claim 1.

\* \* \* \* \*